(12) United States Patent
Saraf et al.

(10) Patent No.: US 9,202,614 B2
(45) Date of Patent: Dec. 1, 2015

(54) SUPERCONDUCTING LEVITATION SURFACES

(71) Applicant: QUANTUM EXPERIENCE LTD., Rehovot (IL)

(72) Inventors: Amir Saraf, Tel Aviv (IL); Boaz Almog, Rehovot (IL)

(73) Assignee: RAMOT AT TEL AVIV UNIVERSITY LTD., Tel Aviv (IL)

( * ) Notice: Subject to any disclaimer, the term of this patent is extended or adjusted under 35 U.S.C. 154(b) by 0 days.

(21) Appl. No.: 14/205,571

(22) Filed: Mar. 12, 2014

(65) Prior Publication Data
US 2014/0266523 A1 Sep. 18, 2014

Related U.S. Application Data

(60) Provisional application No. 61/781,253, filed on Mar. 14, 2013.

(51) Int. Cl.
| | |
|---|---|
| *H01F 1/00* | (2006.01) |
| *H01F 6/00* | (2006.01) |
| *H01F 41/02* | (2006.01) |
| *F16C 32/04* | (2006.01) |
| *H01L 39/14* | (2006.01) |

(52) U.S. Cl.
CPC .............. *H01F 6/00* (2013.01); *F16C 32/0438* (2013.01); *H01F 41/02* (2013.01); *H01L 39/143* (2013.01); *Y02E 40/642* (2013.01); *Y10T 29/49014* (2015.01)

(58) Field of Classification Search
CPC ........... H01F 6/00; H01B 12/06; H01B 13/00
USPC ........... 335/216, 296, 303; 29/599; 174/125.1
See application file for complete search history.

(56) References Cited

U.S. PATENT DOCUMENTS

| | | | |
|---|---|---|---|
| 2005/0285452 A1* | 12/2005 | Putman et al. | 310/12 |
| 2009/0203529 A1* | 8/2009 | Tarrant et al. | 505/237 |
| 2013/0061458 A1* | 3/2013 | Lee et al. | 29/599 |

FOREIGN PATENT DOCUMENTS

| | | | |
|---|---|---|---|
| JP | 2000021621 A | * | 1/2000 |
| WO | 9506208 A1 | | 3/1995 |
| WO | 9532542 A1 | | 11/1995 |

OTHER PUBLICATIONS

Sass et al., "Superconducting Levitation Using Coated Conductors", IEEE Transactions on Applied Superconductivity, vol. 23, No. 3, 5 pages, Jun. 2013.

(Continued)

*Primary Examiner* — Bernard Rojas
(74) *Attorney, Agent, or Firm* — D. Kliger I.P. Services Ltd.

(57) ABSTRACT

Apparatus, consisting of a substrate and planar tapes which have respective mutually-opposing first and second faces. The tapes have edges connecting the faces, and each tape has a superconducting material on at least the first face thereof. The tapes may be arranged on the substrate so as to define at least a first set of at least one of the planar tapes overlying a surface of the substrate so that the edges of adjacent sections of the tapes in the first set butt together along a first direction over the surface. The tapes may also be arranged so that a second set of at least another one of the planar tapes overly the first set so that the edges of adjacent sections of the tapes in the second set butt together along a second direction that is different from the first direction.

23 Claims, 6 Drawing Sheets

(56) References Cited

OTHER PUBLICATIONS

Sass et al., "Application of 2G-Tape for Passive and Controlled Superconducting Levitation", IEEE Transactions on Applied Superconductivity, vol. 21, No. 3, pp. 1511-1514, Jun. 2011.

Patel et al., "Trapped fields up to 2 T in a 12 mm square stack of commercial superconducting tape using pulsed field magnetization", Fast Track Communication, Superconductor Science and Technology, issue 26, 7 pages, Jan. 23, 2013.

Emerson & Cuming, "STYCAST® 1266", Datasheet, 5 pages, Oct. 23, 2001.

Den Braven Sealants, "Zwaluw Hybrifix Super 7", Technical Datasheet, 2 pages, Sep. 13, 2010.

* cited by examiner

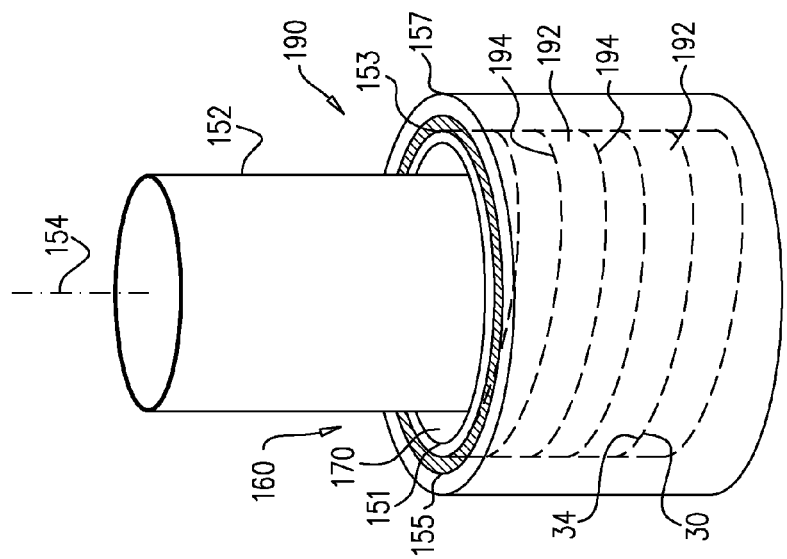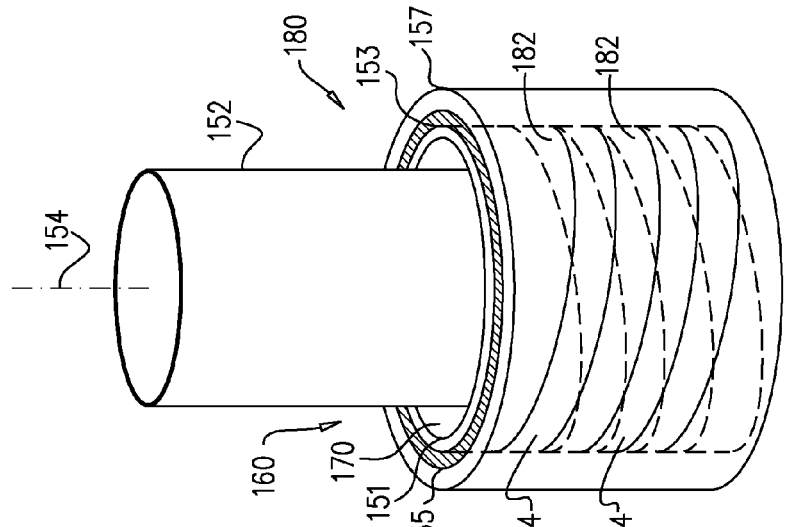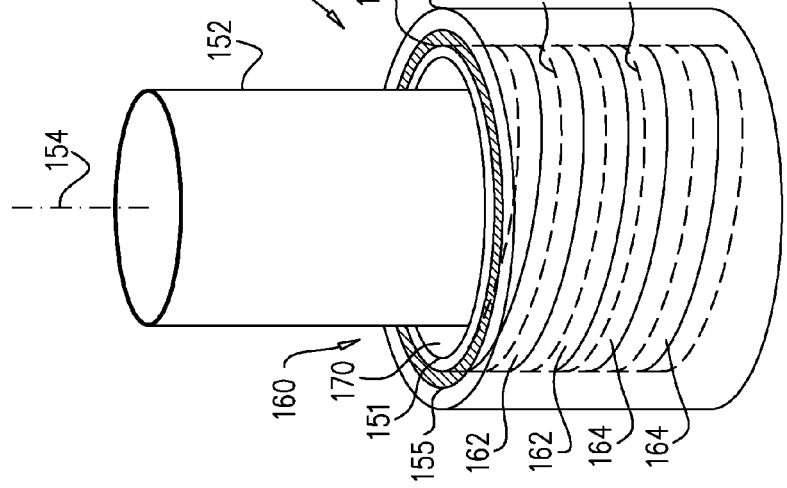

SUPERCONDUCTING LEVITATION SURFACES

CROSS-REFERENCE TO RELATED APPLICATION

This application claims the benefit of U.S. Provisional Patent Application 61/781,253, filed 14 Mar. 2013, which is incorporated herein by reference.

FIELD OF THE INVENTION

The present invention relates generally to superconductors, and specifically to flexible tapes/ribbons having a surface coated with a superconductor.

BACKGROUND OF THE INVENTION

PCT application WO 1995006208, to Weinberger, which is incorporated herein by reference, describes a superconductor magnetic bearing. A stator of the bearing has a superconductor thin film assembly positioned to interact with a magnet to produce a levitation force on a shaft of the bearing.

PCT application WO 1995032542, to Hull, which is incorporated herein by reference, describes an apparatus and method for reducing magnetic field inhomogeneities which produce rotational loss mechanisms in high temperature superconducting magnetic bearings. Magnetic field inhomogeneities are claimed to be reduced by dividing high temperature superconducting structures into smaller pellets.

An article entitled "Superconducting Levitation Using Coated Conductors" by Sass et al., published in IEEE Transactions on Applied Superconductivity, Vol. 23, No. 3, which is incorporated herein by reference, describes superconducting magnetic bearings using second-generation wires. The article describes using stacked wires in evaluation of the bearings.

An article entitled "Application of 2G-Tape for Passive and Controlled Superconducting Levitation" by Sass et al., published in IEEE Transactions on Applied Superconductivity, Vol. 21, No. 3, which is incorporated herein by reference, describes implementing a double pancake superconducting coil to test 2G wires in levitation technology.

An article entitled "Trapped fields up to 2 T in a mm square stack of commercial superconducting tape using pulsed field magnetization" by Patel et al., published in Supercond. Sci. Technol. 26 (2013), which is incorporated herein by reference, describes using a stack of superconducting tape pieces as a quasi-permanent magnet activated by a pulsed magnetic field.

The description above is presented as a general overview of related art in this field and should not be construed as an admission that any of the information it contains constitutes prior art against the present patent application.

SUMMARY OF THE INVENTION

An embodiment of the present invention provides apparatus, including:

a substrate;

planar tapes which have respective mutually-opposing first and second faces and edges connecting the faces, each tape consisting of a superconducting material on at least the first face thereof, and which are arranged on the substrate so as to define at least:

a first set of at least one of the planar tapes overlying a surface of the substrate so that the edges of adjacent sections of the tapes in the first set butt together along a first direction over the surface; and a second set of at least another one of the planar tapes overlying the first set so that the edges of adjacent sections of the tapes in the second set butt together along a second direction that is different from the first direction.

Typically the surface is a topological equivalence of a disc surface, and the planar tapes consist of discrete tape segments, and the first set consists of a first plurality of the discrete tape segments, and the second set consists of a second plurality of the discrete tape segments.

In a disclosed embodiment the surface is a topological equivalence of a cylindrical surface, and the first set consists of a first single planar tape overlying the surface, and the second set consists of a second single planar tape overlying the first single planar tape.

In a further disclosed embodiment the second set includes one or more layers of the planar tapes, and the apparatus includes an open-celled foam overlaying at least one of the substrate and an outermost layer of the second set of tapes.

In a yet further disclosed embodiment the apparatus includes at least one of a magnet, a bulk superconductor, and a set of tape layers behaving as a bulk superconductor, retained by a chassis in a first location thereof, and the substrate and the first and second set are retained by the chassis in a second location thereof so as to stabilize a carriage having the chassis in a magnetic field.

Typically, at least a portion of the surface is configured to be orthogonal to a magnetic field intersecting the surface.

There is further provided, according to an embodiment of the present invention apparatus, including:

a substrate;

planar tapes which have respective mutually-opposing first and second faces and edges connecting the faces, each tape consisting of a superconducting material on at least the first face thereof, and which are arranged on the substrate so as to define at least:

a first set of at least one of the planar tapes overlying a surface of the substrate so that the edges of adjacent sections of the tapes in the first set are in proximity to each other and define respective seams; and a second set of the planar tapes overlying the first set so that the tapes in the second set overly the respective seams.

There is further provided, according to an embodiment of the present invention, a method, including:

providing a substrate; and forming an arrangement of planar tapes on the substrate, the planar tapes having respective mutually-opposing first and second faces and edges connecting the faces, each tape having a superconducting material on at least the first face thereof, the arrangement defining at least:

a first set of at least one of the planar tapes overlying a surface of the substrate so that the edges of adjacent sections of the tapes in the first set butt together along a first direction over the surface; and a second set of at least another one of the planar tapes overlying the first set so that the edges of adjacent sections of the tapes in the second set butt together along a second direction that is different from the first direction.

There is further provided, according to an embodiment of the present invention, a method, including:

providing a substrate; and forming an arrangement of planar tapes on the substrate, the planar tapes having respective mutually-opposing first and second faces and edges connecting the faces, each tape having a superconducting material on at least the first face thereof, the arrangement defining at least:

a first set of at least one of the planar tapes overlying a surface of the substrate so that the edges of adjacent sections of the tapes in the first set are in proximity to each other and define respective seams; and a second set of the planar tapes overlying the first set so that the tapes in the second set overly the respective seams.

The present invention will be more fully understood from the following detailed description of the embodiments thereof, taken together with the drawings in which:

BRIEF DESCRIPTION OF THE DRAWINGS

FIG. 4A is a schematic illustration of a bearing, according to an embodiment of the present invention;

FIG. 4B is a schematic illustration of an alternative bearing, according to an embodiment of the present invention;

FIG. 4C is a schematic illustration of a further alternative bearing, according to an embodiment of the present invention;

DETAILED DESCRIPTION OF EMBODIMENTS

Overview

Figure 1:
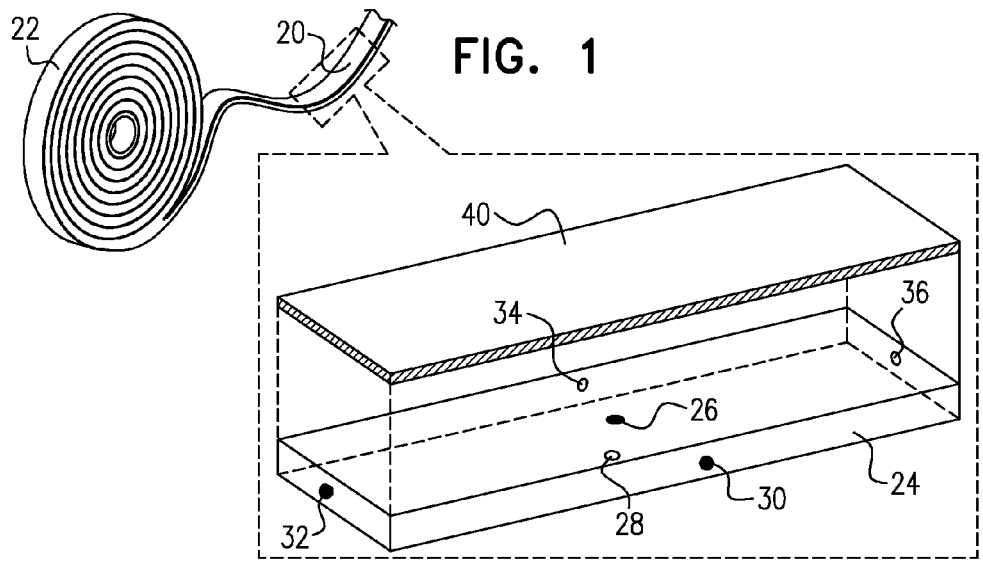
FIG. 1 which is a schematic exploded view of a planar tape section, according to an embodiment of the present invention.

Embodiments of the present invention use assemblages of planar tapes which have mutually-opposing faces, the faces being connected by edges of the tapes. The tapes also comprise a superconducting material which overlies at least one of the faces. In some embodiments further layers overlay the superconducting material. Typically, the superconducting material comprises a type II superconductor, which in a magnetic field has the property of flux pinning, and the flux pinning provides stable levitation and/or suspension for the embodiments in the presence of a magnetic field.

In the disclosure and in the claims the term levitation, and derivatives of the term such as levitating, is assumed to include suspension and derivatives of the term suspension. In both cases the flux pinning in a superconductor provides stable spatial locking of a levitating object with respect to a magnet generating the flux being pinned.

In one configuration a first set of the planar tapes overlies a surface of a substrate, and a second set of planar tapes overlies the first set. The first set is arranged so that edges of adjacent sections of the tapes in the first set butt together along a first direction over the surface. The second set is also arranged so that edges of adjacent sections of the tapes in the second set butt together along a second direction. The first and second directions are different.

In an alternative configuration a first set of the planar tapes overlies a surface of a substrate, and a second set of planar tapes overlies the first set. In the alternative embodiment the edges of adjacent tapes in the first set are in proximity to each other and define respective seams. The second set overlies the first set so that the tapes in the second set overly the respective seams.

In both embodiments referred to above, the seams of the first set are covered by the tapes of the second set. Flux pinning is typically weak at the edges of the tapes, so the magnetic field at the edge is freer to move than at the center of the tape. By overlaying the first tape seams with a second layer of tape, embodiments of the present invention overcome this problem, Embodiments of the present invention may use one or other of the configurations described above, or variations on the configurations, to provide systems which stably levitate in a magnetic field, so that there is a tendency to counteract deviations of the systems from an initial position. Typically, liquid nitrogen is used to cool and activate the configuration, and in some embodiments an open-celled foam is coupled to the configuration, the foam enhancing the cooling properties of the liquid nitrogen. In alternative embodiments one or more of the configurations is coupled to a unit having permanent magnets and/or superconductors exhibiting a strong diamagnetic force (e.g., due to the Meissner effect) and the coupled configuration acts to stabilize levitation of the unit.

Configurations of the present invention may be arranged as comprising substantially flat surfaces, and/or as comprising curved surfaces.

DETAILED DESCRIPTION

Superconductors in a magnetic field are typically subject to two types of force generated by the field. A first type, which is always repulsive, is essentially a diamagnetic force caused by the Meissner effect, which expels the magnetic field from the superconductor. A second type of force operates as a stabilizing or countervailing force, acting to oppose any movement or tendency to move of the superconductor. The second type is caused by the magnetic field being "pinned" within the superconductor, and is referred to as a flux pinning force. Because of its property of opposing or tending to oppose movement, the flux pinning force may be likened to a frictional force.

Superconductors may be divided into two categories: bulk superconductors where the repulsive diamagnetic force magnitude is substantially larger than any flux pinning force magnitude, and thin superconductors, where typically the ratio of the flux pinning force magnitude to any repulsive force magnitude is at least one third.

Embodiments of the present invention use multiple layers of tapes that are coated with superconducting material. To achieve the ratio of force magnitudes referred to above, for thin superconductors, a further dimensional ratio may be applied: for a set of layers of tapes to act as a thin superconductor, a smallest lateral dimension of the set is 100 times or more the total thickness of the superconducting material.

For example, consider a tape that is 10 cm×100 cm×200 microns thick, and that contains a 1 micron thick superconducting material. The smallest lateral dimension is 10 cm.

If 100 layers of the tape are constructed, then the total thickness of superconducting material is 100 microns, and the dimensional ratio is 10 cm:100 micron=1,000:1 This set of tape layers consequently behaves as a thin superconductor.

If 2,000 layers of the tape are constructed, then the total thickness of superconducting material is 2,000 microns, and the dimensional ratio is 10 cm:2,000 micron=50:1. This set of tape layers consequently behaves as a bulk superconductor.

Except where otherwise stated, a superconductor or superconducting material in the present disclosure and in the claims is assumed to comprise a thin superconductor which enables magnetic field penetration into the superconductor. In the disclosure and in the claims, a thin superconductor has the dimensional ratio specified above. (The thin superconductor is typically a two-dimensional structure, so that in the present disclosure the term levitation surface is also used as being synonymous with the term thin superconductor.)

The magnitude of the flux pinning force is typically approximately proportional to the gradient of the component of the magnetic field orthogonal to the surface of the thin superconductor.

Reference is now made to FIG. 1, which is a schematic exploded view of a planar tape section 20, according to an embodiment of the present invention. Embodiments of the present invention use a plurality of generally similar planar tape sections 20, also referred to herein as planar tapes 20 or just as tapes 20, and the tape sections are typically cut from a tape-reel 22. However, there is no necessity that tapes 20 are cut from a tape-reel, and the tapes of the present invention may be formed by this method, or by any other convenient method.

Tape 20 comprises an underlying ribbon 24, which may typically be formed of any convenient solid flexible material, such as a dielectric, a semiconductor, or a conductor. Examples of the dielectric or semiconductor used to form ribbon 24 comprise sapphire and silicon. In the case of ribbon 24 being formed from a conductor, the conductor typically comprises a metal or a metal alloy such as stainless steel or nickel-tungsten, although a conductive ribbon may comprise any other conductor.

Ribbon 24 is formed as a three-dimensional (3D) structure, having mutually-opposing faces 26 and 28 which are approximately parallel to each other. The faces are connected by edges 30, 32, 34, and 36, which are typically approximately orthogonal to the faces of the ribbon. For each tape section 20, a first pair of opposing edges, such as edges 30, 34 is typically significantly longer than a second pair of opposing edges such as edges 32, 36. Edges 30, 34 are also herein termed the longer edges of the tape section. Typical widths between first pair of longer edges 30, 34 lie in the range of approximately 4 mm to approximately 15 cm, although embodiments of the present invention include widths larger or smaller than this range.

A superconducting material 40, typically a high temperature superconductor and also referred to herein as superconductor 40, coats at least one face of ribbon 24. While in some embodiments further layers, such as silver or copper, may overlay superconductor 40, for simplicity, in the present description, these layers are assumed to be absent. A person having ordinary skill in the art will be able to adapt the description, mutatis mutandis, to accommodate the presence of layers overlying superconductor 40. Except where otherwise indicated in the following description, for clarity and simplicity superconductor 40 is assumed to coat face 26, and face 28 is assumed to be uncoated. An example of superconductor 40 is an yttrium barium copper oxide (YBCO). Superconductor 40 is a thin superconductor, referred to above, and a typical thickness for superconductor 40 is approximately 1 micron, although the thickness may be larger or smaller than this value.

As described below, assemblies of tape sections 20, in different configurations, are used in embodiments of the present invention.

Figure 2:
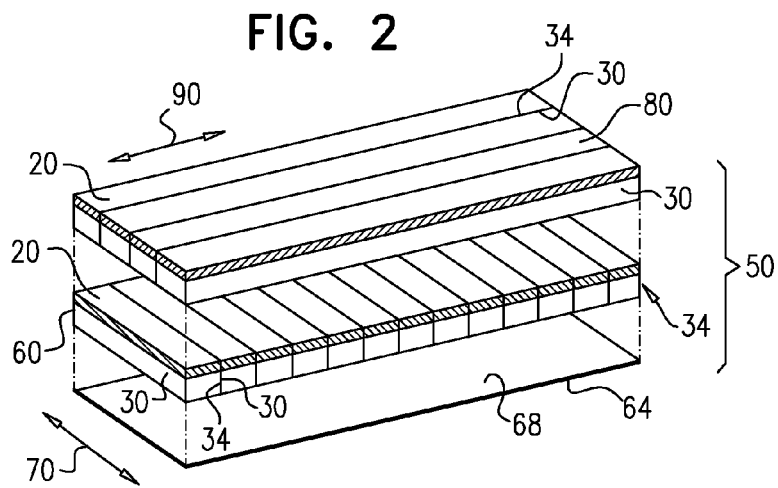
FIG. 2 is a schematic illustration of a configuration of tapes, according to an embodiment of the present invention.

FIG. 2 is a schematic illustration of a first configuration 50 of tapes 20, according to an embodiment of the present invention. FIG. 2 illustrates configuration 50 as an exploded view. In configuration 50 a first set 60 of planar tapes 20 are arranged in a first plane, or layer, so that longer edges 30, 34 of adjacent tape sections 20 butt together. Set 60 is then arranged to overlay, and typically attach, to a substrate 64. The attachment to substrate 64 may be by rigid mechanical means such as by using screws. Alternatively or additionally, the attachment of tapes 20 to substrate 64 may be by using an adhesive, typically a cryogenic adhesive such as an epoxy resin. The inventors have found that epoxy resin STYCAST® 1266, produced by Emerson and Cumming of Billerica, Mass., is a suitable adhesive. Alternatively, Zwaluw Hybrifix Super 7, produced by Den Braven Sealants, of OOsterhuit, the Netherlands, may also be used.

While configuration 50 may exist in substantially any orientation, for clarity and simplicity in the description herein substrate 64 is assumed to be below set 60, which covers and attaches to an upper surface 68 of the substrate. Typically, although not necessarily, set 60 is configured to completely cover surface 68 of substrate 64 to which the set is attached, so that set 60 tiles the complete upper surface 68 of substrate 64. Such a complete covering situation is illustrated in FIG. 2. In some embodiments set 60 does not completely cover upper surface 68, so that set 60 only tiles a sub-section of the upper surface.

The butting edges, i.e., longer edges 30, 34, of set 60, define a direction 70 for the set, the direction being illustrated in FIG. 2 as a double-headed arrow.

In configuration 50 a second set 80 of planar tapes are arranged in a second plane so that, as for the first set, longer edges 30, 34 of adjacent tape sections 20 butt together. However, the tape sections of the butting edges of the second set are configured to define a different direction 90 (illustrated in FIG. 2 by a second double-headed arrow) for set 80. In some embodiments directions 70 and 90 are orthogonal.

Set 80 is then arranged to overlay and typically attach to first set 60. Typically, set 80 is configured to completely cover set 60. The attachment between the two sets is typically by one of the methods described above for the attachment of the first set to substrate 64.

For simplicity, in FIG. 2 upper surface 68 is illustrated as being a flat, plane, surface, and sets 60 and 80 are correspondingly flat, plane surfaces. However, there is no necessity that surface 68 and overlaying sets 60 and 80 are flat planes. In general, surface 68 may be any curved or non-flat plane, and sets 60 and 80 will be corresponding planes. Furthermore, substrate 64 is not necessarily rigid, and in some embodiments the substrate is flexible, causing surface 68, and attached sets 60 and 80, to change their shape as the substrate flexes.

Figure 3:
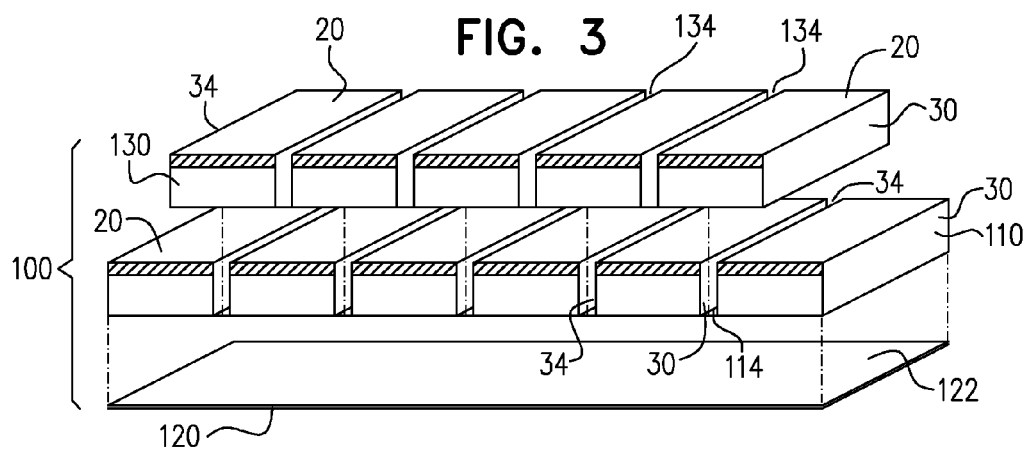
FIG. 3 is a schematic illustration of an alternative configuration of tapes, according to an embodiment of the present invention.

FIG. 3 is a schematic illustration of a second configuration 100 of tapes 20, according to an embodiment of the present invention. FIG. 3 illustrates configuration 100 as an exploded view. In configuration 100 a first set 110 of planar tapes are arranged in a first plane so that longer edges 30, 34 of adjacent tape sections 20 are in proximity to each other, and are parallel to each other. The adjacent tapes thus generate seams 114 between adjacent longer edges 30 and 34, the seams typically comprising gaps between the longer edges of adjacent tapes. In some embodiments longer edges 30 and 34 of adjacent tapes butt against each other, so that there are no gaps between adjacent tapes and seams 114 effectively have zero width.

Set 110 is then arranged to overlay and typically attach to a substrate 120. The method of attachment to substrate 120 is typically substantially similar to one of the attachment methods described above for configuration 50.

Typically, as for configuration 50, set 110 is configured to completely cover, except for embodiments wherein seams 114 have a non-zero width, an upper surface 122 of substrate 120. Such a complete covering situation is illustrated in FIG. 3. In some embodiment set 110 does not completely cover upper surface 122, so that set 110 only covers a sub-section of the upper surface. While surface 122 is referred to herein for simplicity as an upper surface, it will be understood that configuration 100, as for configuration 50, may exist in substantially any orientation.

In configuration 100 a second set 130 of planar tapes 20 are arranged in a second plane so that the tapes of the second set overly and cover the seams of the first set. Second set 130 may be attached to first set 110 by any of the attachment methods described above. In one embodiment second set 130 is configured to be congruent to first set 110, so that set 130 may be thought of as corresponding to a translation of set 110. In such a case the tapes of second set 130 are the same width as the tapes of first set 110, and there are seams 134 between the tapes of the second set. However, there is no necessity that the two sets be congruent, so that set 130 may comprise tapes that have larger or smaller widths than the tapes of set 110, and seams 134 may be smaller or larger than seams 114. In some embodiments, longer edges 30 and 34 of adjacent tapes of the second set butt against each other, so that seams 134 effectively have zero width.

In configuration 100, substrate 120 may be rigid or flexible, and upper surface 122 may be flat or curved.

In some embodiments of the present invention surface 68 (FIG. 2) or surface 122 (FIG. 3) is topologically equivalent to a surface defined by a disc. In these cases tapes 20 of each of corresponding sets 60, 80, 110, and 130 may comprise a plurality of discrete tapes 20, herein also referred to as discrete tape segments.

In alternative embodiments of the present invention surface 68 or surface 122 is topologically equivalent to a surface defined by a cylinder. In these cases tapes 20 of each of corresponding sets 60, 80, 110, and 130 may comprise a single tape 20. Each single tape 20 is typically wound on its receiving surface (surface 68 or 122), and the winding is typically in a helical configuration.

Thus, in configuration 50, set 60 may comprise a first single tape that is wound, in a helical "close-packed" configuration, over surface 68 so that edge 30 of a section of the first single tape butts with edge 34 of a following section of the single tape. The direction of the helical butts of the first single tape defines direction 70. Similarly, set 80 may comprise a second single tape that is wound, in a helical close-packed configuration, over set 60 so that edge 30 of a section of the second single tape butts with edge 34 of a following section of the second single tape. The direction of the helical butts of the second single tape defines direction 90. As stated above, direction 70 is different from direction 90, and the difference may be implemented, for example, by having the helix angle of set 60 different from the helix angle of set 80, and/or by having one helix wound clockwise and the other helix wound counter-clockwise.

In configuration 100 set 110 may comprise a first single tape that is wound, in a helical configuration, over surface 110 so that edge 30 of a section of the first single tape is in proximity to edge 34 of a following section of the single tape, forming a single helical seam 134 for set 110. Set 130 may comprise a second single tape that is wound, in a generally similar helical configuration to that of the first single tape, but so that the second single tape covers single helical seam 134.

While the description above has referenced two sets of tapes, which are in respective layers, it will be understood that embodiments of the present invention comprise more than two layers of tape. It will also be understood that while a given tape layer may overlay another tape layer and/or a substrate, there is no necessity that the two layers contact each other, or that any given layer contacts the substrate, since in both cases there may be intervening layers.

For simplicity, the description above has assumed that tapes within a given layer have the same width. It will be appreciated that this is by way of example, so that within a given layer tapes may have different widths. Similarly, different layers of tapes may have different widths of tape. Furthermore, tapes are not necessarily elongated, and may be any convenient shape, such as square or rectangular.

Examples of variations of configurations 50 and 100 described above, and which will be apparent to those having ordinary skill in the art, are given below.

As a first example, referring back to configuration 50, a third set of tapes, generally similar to first set 60, may overlay set 80. The third set may have a defining direction corresponding to direction 70 of the first set. Alternatively, the defining direction of the third set may be different from directions 70 and 90 of the first and second sets of configuration 50.

As a second example, referring back to configuration 100, a third set of tapes may overlay second set 130 of tapes, and may be arranged so that the tapes of the third set overly and cover seams 134 of the second set.

Characteristics of configuration 50 and configurations 100 may be combined. As a third example, referring back to configuration 50, a third set of tapes may be arranged to cover second set 80. The relationship between the third set and the second set may be as for configuration 100, so that tapes of the third set overlay the seams of the second set, i.e., the lines defined by the regions where longer edges 30, 34 of the adjacent tape sections 20 of set 80 butt together.

Other examples of variations of configurations 50 and 100, or of combinations between the two configurations, will be apparent to those having ordinary skill in the art, and all such examples are assumed to be comprised within the scope of the present invention.

Embodiments of the present invention, because tape sections 20 comprise a high temperature superconductor, possess the property of flux pinning when the superconductor is below its critical temperature. Consequently, configurations such as configuration 50 or configuration 100, or variations thereof, are able to levitate in a magnetic field, i.e., to be suspended in space so as to counteract the force of gravity, or some other force acting in any direction on the configuration. Examples of embodiments of the present invention using levitation are provided below.

In embodiments of the present invention, the seams or edges of a tape are covered with a superconductor. Flux pinning is typically weak at the edges of the tapes, so the magnetic field at the edges is freer to move than at the center of the tape. By covering the edges, embodiments of the present invention overcome this problem, FIG. 4A is a schematic illustration of a bearing 150, according to an embodiment of the present invention. Bearing 150 comprises a central cylindrical magnet 152, which is configured to generate a magnetic field, external to the magnet, having a component normal to an axis 154 of the magnet. Surrounding magnet 152 is a four walled cylindrical cryostat 160 having concentric cylindrical walls 151, 153, 155, and 157. (Wall 151 is the innermost wall; wall 157 is the outermost wall.) The space between the two inner walls 151, 153 may be evacuated, and the space between the two outer walls 155, 157 may also be evacuated.

Wall 153 may be used as a substrate, and is also referred to herein as substrate 153, upon which is wound a first single tape 162 and a second single tape 164 in the configuration for a cylindrical surface described above with reference to configuration 100. In other words, first single tape 162 is wound on substrate 153 so as to generate a single seam 166, and single tape 164 is wound so as to cover the single seam.

If tapes 162 and 164 are cooled below the critical temperature of their superconductor, by placing liquid nitrogen in the space between walls 153 and 155, then magnet 152 effectively levitates with respect to the tapes, generating a gap 170 between the magnet and innermost wall 151. Magnet 152 is then able to rotate with respect to the cryostat with virtually no frictional force, so that bearing 150 is essentially frictionless.

It will be appreciated that the four-walled cryostat described herein provides a good system for cooling the tapes with liquid nitrogen, while insulating the liquid nitrogen, and while having the tapes close to the internal magnet of the bearing. It will also be appreciated that rather than all of wall 153 being covered by superconducting material, only a portion of the wall may be covered.

FIG. 4B is a schematic illustration of a bearing 180, according to an embodiment of the present invention. Apart from the differences described below, the operation of bearing 180 is generally similar to that of bearing 150 (FIG. 4A), and elements indicated by the same reference numerals in both bearings 150 and 180 are generally similar in construction and in operation. In bearing 180 a first single tape 182 and a second single tape 184 are wound on substrate 153 in the configuration for a cylindrical surface described above with reference to configuration 50. In other words, first single tape 182 is wound on substrate 153 in a first direction, and single tape 184 is wound, in a different direction, over tape 182.

In some embodiments, the direction of one of tapes 182 and 184 is aligned with the axis of substrate 153, In this case the aligned tape comprises a multiplicity of tape segments aligned with the axis.

As for bearing 150, if tapes 182 and 184 are cooled below the critical temperature of their superconductor, then the tapes, with attached substrate 153, levitate with respect to magnet 152. As described above for bearing 150, bearing 180 is also essentially frictionless.

FIG. 4C is a schematic illustration of a bearing 190, according to an embodiment of the present invention. Apart from the differences described below, the operation of bearing 190 is generally similar to that of bearings 150 and 180 (FIGS. 4A and 4B), and elements indicated by the same reference numerals in bearings 150, 180 and 190 are generally similar in construction and in operation. In bearing 190, a single tape 192 is wound on substrate 153 in a helical close-packed configuration, so that an edge 30 of a section of the single tape butts with an edge 34 of a following section of the single tape, and so that the single tape forms a single seam 194 where edges 30 and 34 butt against each other. In some embodiments a second tape (not shown in the diagram) is wound in a helical close-packed configuration over tape 192, the second tape having a different width to the first tape. The second tape may be wound so that the second tape overlays single seam 194.

Figure 5:
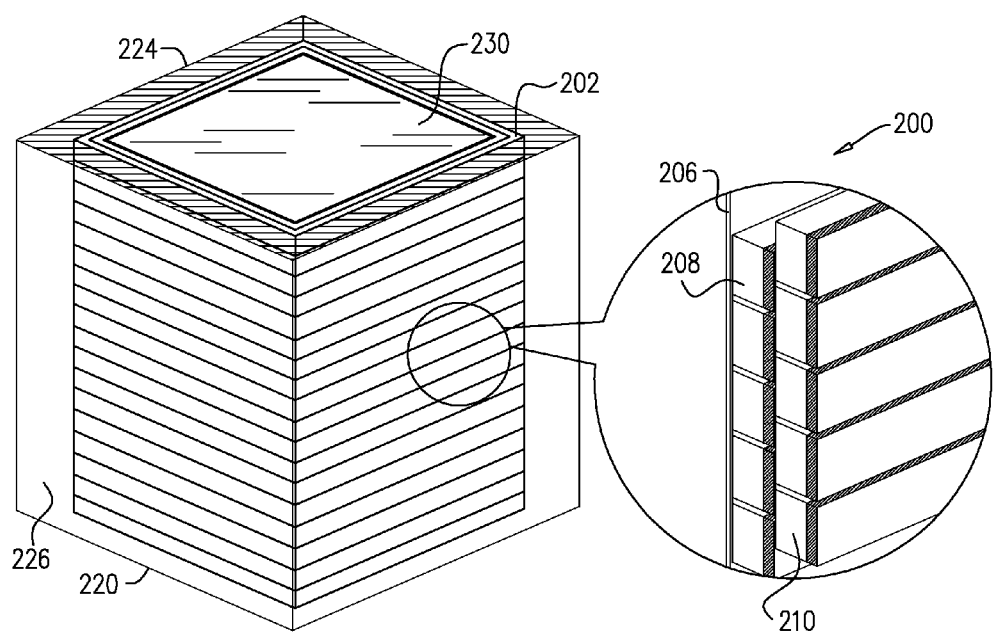
FIG. 5 is a schematic illustration of a cryostat, according to an embodiment of the present invention.

FIG. 5 is a schematic illustration of a cryostat 200, according to an embodiment of the present invention. Cryostat 200 comprises an inner container 202, which is typically formed from one of the configurations described above (FIGS. 1-4C). For simplicity, in the following description container 202 is assumed to be formed according to configuration 100, and those having ordinary skill in the art will be able to adapt the description for other configurations of the present invention.

Container 202 is formed as a rigid substrate 206, overlaid by a first set 208 of tapes 20. Set 208 is overlaid by a second set 210 of tapes 20, and substrate 206, first set 208, and second set 210 respectively correspond to substrate 120, first set 110, and second set 130 of configuration 100 (FIG. 3).

An outer container 220 is rigidly connected to container 202 by an insulating seal 224, so as to form a space 226 between the two containers, and the space is typically evacuated, to form cryostat 200.

Cryostat 200 may be placed in a magnetic field, for example in a field produced by a rail of permanent magnets (not shown in the diagram) external to outer container 220. If liquid nitrogen 230 is introduced into the inner container so as to cool sets 208 and 210 below their critical temperature, then the cryostat, and any object attached to the cryostat, will levitate with respect to the magnetic field.

This arrangement allows thermal insulation of the superconductor and liquid nitrogen, while keeping the superconductor-magnet distance minimal to maximize the levitation force.

It will be understood that cryostat 200 may be formed in different shapes, such as a cylinder. In the case of a cylinder, a circular magnet surrounding the cylinder is able to act as a friction-less bearing.

Figure 6A:
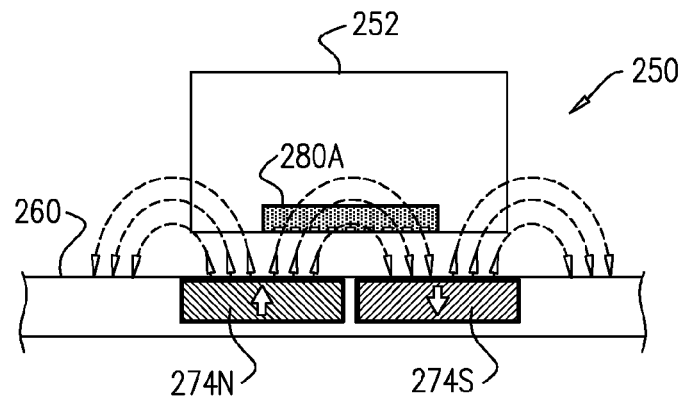
FIG. 6A is a schematic cross-section of a levitating carriage.
Figure 6B:
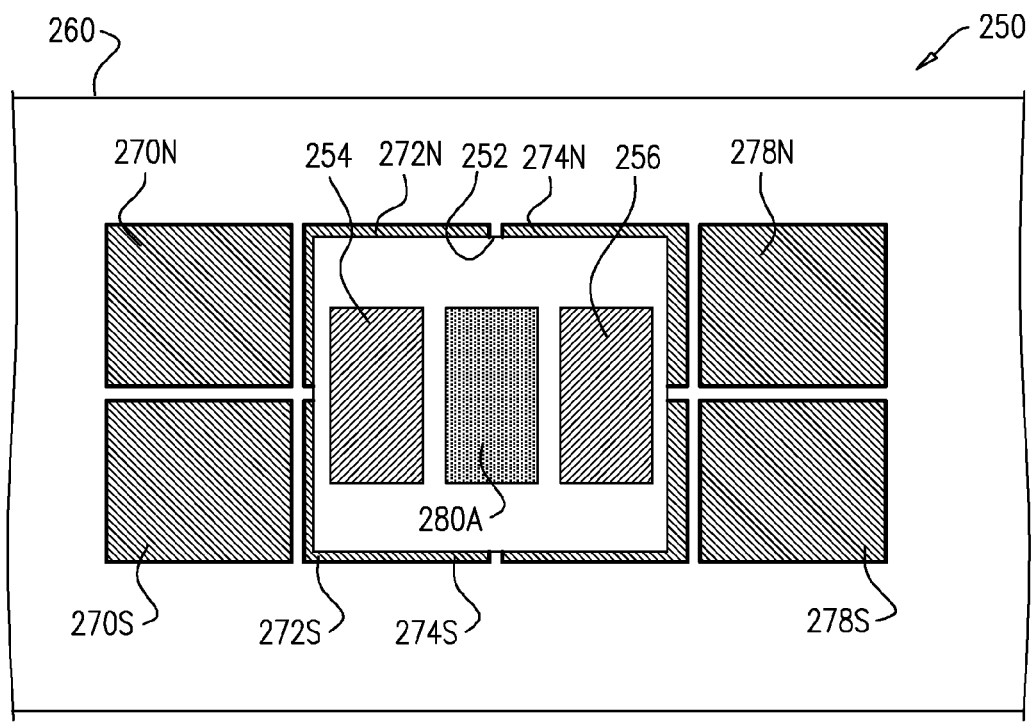
FIG. 6B is a schematic top view of the carriage, according to an embodiment of the present invention.

FIG. 6A is a schematic cross-section of a levitating carriage 250, and FIG. 6B is a schematic top view of the carriage, according to an embodiment of the present invention. The cross-section of FIG. 6A is taken across the center of the carriage. Carriage 250 comprises a chassis 252 to the base of which are attached permanent magnets. Alternatively or additionally, superconductors, herein assumed to comprise bulk superconductors, which do not have the property of flux pinning or wherein flux pinning is significantly less than the diamagnetic force acting on the superconductors, may be attached to the base of the chassis. These bulk superconductors act as magnets which inherently oppose the magnetic field wherein the superconductors are placed. For simplicity, the following description assumes that two generally similar such bulk superconductors 254, 256, are fixedly attached to the base of the chassis, but those having ordinary skill in the art will be able to adapt the description in the case that permanent magnets are attached to the chassis base.

Carriage 250 is placed above a rail 260 of two lines of permanent magnets 270N, 270S; 272N, 272S; . . . 278N, 278S. If the bulk superconductors are cooled below their critical temperature, the Meissner effect causes the carriage to levitate strongly and repulsively above rail 260. However, while the levitation force is strong, it is also inherently unstable, so that without other means, the location of carriage 250 relative to rail 260 is unstable.

Hereinbelow, a superconductor 280A, 280B, 280C, . . . is assumed, by way of example, to be arranged in one or more of the configurations of type II superconductors described above. Superconductors 280A, 280B, 280C, . . . are generically referred to herein as superconductor 280. If superconductor 280 is cooled below its critical temperature, flux pinning with the magnetic field from the rail array occurs in the superconductor.

Embodiments of the present invention attach one or more type II superconductors 280A to the base of chassis 252. On cooling below its critical temperature, the flux pinning in superconductor 280A acts to counteract the instability caused by bulk superconductors 254, 256 by providing both vertical and lateral stability to the attached chassis. Thus, even with the active presence of the strongly levitating but unstable bulk superconductors, the location of carriage 250 with respect to rail 260 stabilizes. The attached superconductor 280A may also provide shock absorption for carriage 250.

A similar stabilizing effect for carriage 250, by attaching superconductor 280A to chassis 252, occurs if, instead of bulk superconductors being used, permanent magnets are attached to the carriage. Those having ordinary skill in the art will be able to modify the description, mutatis mutandis, to account for the change from bulk superconductors to permanent magnets.

Carriage 250 may be used to transfer weights, in a substantially frictionless manner, along rail 260.

Figure 7:
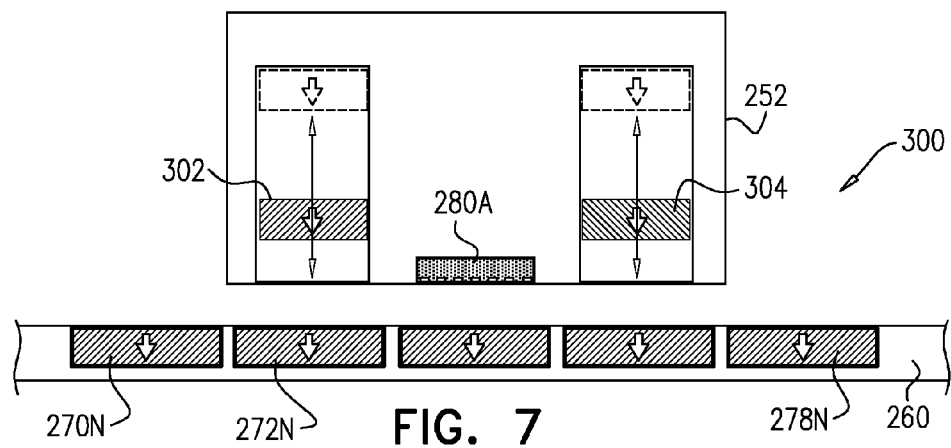
FIG. 7 is a schematic side view of an alternative levitating carriage, according to an embodiment of the present invention.

FIG. 7 is a schematic side view of a levitating carriage 300, according to an embodiment of the present invention. Apart from the differences described below, the operation of carriage 300 is generally similar to that of carriage 250 (FIGS. 6A and 6B), and elements indicated by the same reference numerals in both carriages 250 and 300 are generally similar in construction and in operation. In carriage 300 superconductors 302, 304 replace superconductors 254, 256, and superconductors 302, 304 are adjustable with respect to the base of chassis 252. The adjustment may be made if the weight carried by carriage 300 changes. Typically, if the weight carried by the carriage increases, then superconductors 302, 304 may be lowered, so as to increase their levitating force while maintaining the relative position of superconductor 280 with respect to rail 260. This is also useful in case the levitation distance is unwantedly reduced (e.g., due to flux creep or mechanical shock) during operation, so that carriage 300 becomes locked in its new position. As for carriage 250, in carriage 300 type II superconductor 280A acts to stabilize the instability associated with the Meissner effect of superconductors 302, 304.

As described above for carriage 250, there is a similar stabilizing effect for carriage 300 due to the presence of type II superconductor 280A, if instead of bulk superconductors 302, 304 being used, permanent magnets are used in carriage 300.

Figure 8:
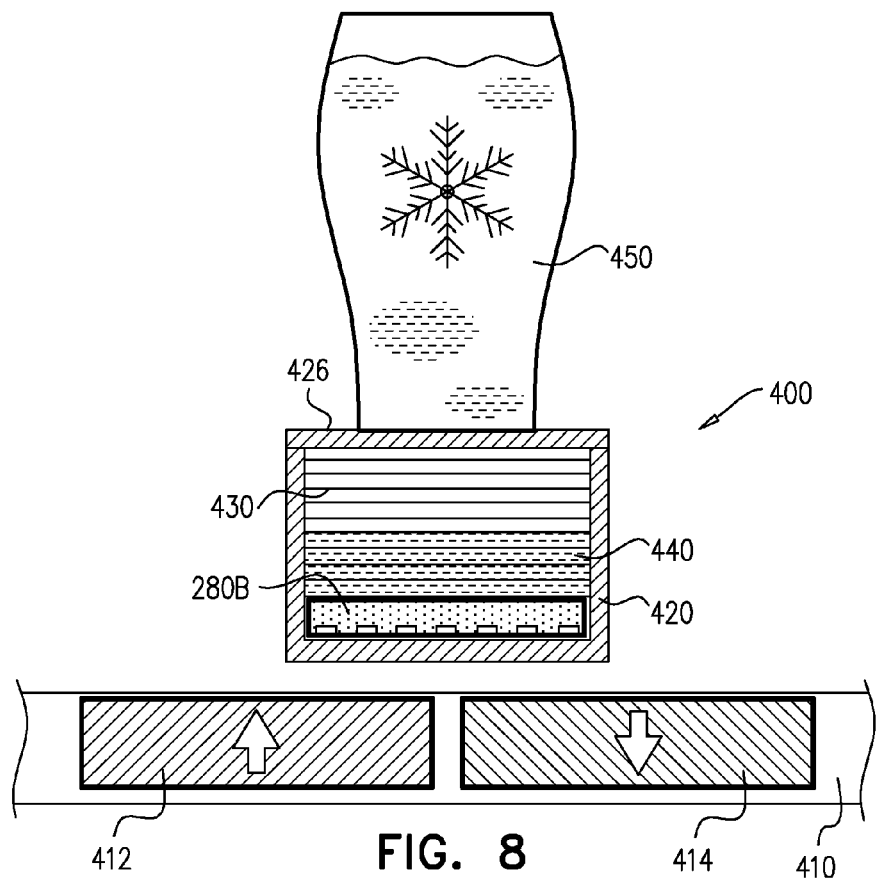
FIG. 8 is a schematic cross-section of a levitating carrier, according to an embodiment of the present invention.

FIG. 8 is a schematic cross-section of a levitating carrier 400, according to an embodiment of the present invention. Carrier 400 is positioned above a rail 410 of permanent magnets 412, 414, . . . , herein assumed to be generally similar to rail 260 (FIG. 6A). Carrier 400 comprises a container 420, which, by way of example, comprises a removable lid 426. At the base of container 420, and within the container, is placed a type II superconductor 280B. An open-celled foam 430 is positioned above superconductor 280B, so that an external surface of the foam contacts the superconductor, and the foam is typically configured to substantially fill the remainder of container 420. In some embodiments, at least part of container 420, and/or removal lid 426, is also formed from open-celled foam 430, so that in these embodiments carrier 400 may be formed solely from open-celled foam and the superconductor.

The open-celled foam used for embodiments of the present invention may comprise any open-celled foam that has open-celled characteristics at room temperature, and which maintains its open-celled characteristics at temperatures below the critical temperature of superconductor 280B, typically liquid nitrogen temperatures. For example, the open-celled foam may be implemented from expanded melamine or polyurethane, although embodiments of the present invention may use any other type of open-celled foam.

Container 420 is at least partially filled with liquid nitrogen 440, which cools superconductor 280B below its critical temperature, so that carrier 400 may levitate above rail 410. The carrier may then be used to transport an object 450, retained by the carrier.

In an alternative embodiment, rather than being positioned over rail 410 so that it is able to move along the rail, carrier 400 may be arranged in a magnetic field configured so that the carrier is levitating in a substantially stationary manner. Such a configuration may be used, for example, as a static levitation display of object 450.

The inventors have found that there are a number of advantages to using open-celled foam in embodiments of the present invention, such as in carrier 400 as well as in other embodiments described below. Some of these advantages are:

The open celled structure provides good thermal insulation for liquid nitrogen ($LN_2$). The liquid nitrogen fills the open cells inside the foam, and outer cells (which contact the surroundings warmer than the $LN_2$) contain trapped nitrogen gas which is a good thermal insulator. In addition, the size of the cells limits convection of the nitrogen. In one experiment the inventors found that using an open-celled foam increased the operation time of a levitation surface by a factor of approximately twenty.

The open celled structure improves the levitation performance. The open cells retain the $LN_2$ in relatively fixed positions, and the retention in turn reduces internal forces on a levitation surface that might be caused by $LN_2$ motion, improving the stability of the surface. In addition, by holding the liquid nitrogen in relatively fixed positions, there is substantially no change in the cooling effect of the $LN_2$ due to motion of the surface.

The open celled structure improves the efficiency of the $LN_2$ cooling. The cells prevent unwanted movement of the $LN_2$. Unwanted movement may typically occur (without the presence of the open celled foam) if the levitation surface accelerates, such as occurs in the case of a rotational bearing.

Figure 9:
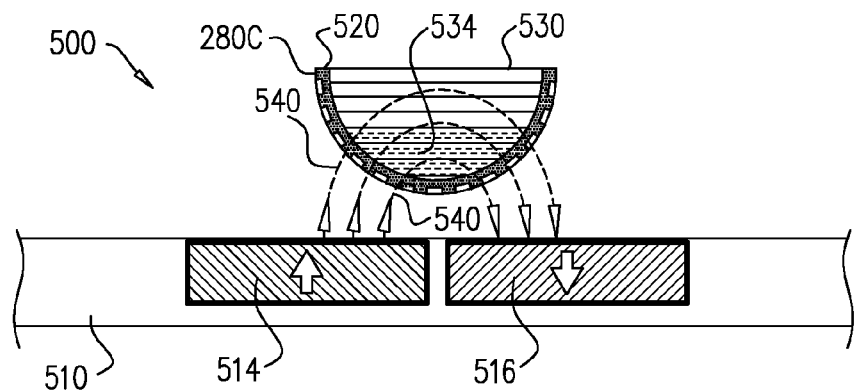
FIG. 9 is a schematic cross-section of a levitating unit, according to an embodiment of the present invention.

FIG. 9 is a schematic cross-section of a levitating unit 500, according to an embodiment of the present invention. Unit 500 is positioned above a rail 510 of permanent magnets 514 and 516, herein assumed to be generally similar to rail 260 (FIG. 6A). Unit 500 comprises one or more superconductors 280C which are shaped in a curved cup-like structure 520 so as to be able to hold liquid. For example, as illustrated, structure 520 may be formed as part of a sphere.

An open-celled foam 530 is positioned above superconductor 280C, so that an external surface of the foam contacts the superconductor, and the foam is typically configured to substantially fill the remainder of structure 520. Addition of liquid nitrogen 534 to the foam enables unit 500 to levitate above rail 510.

It will be understood that the foam referred to above may be arranged to contact a substrate of superconductor 280, and/or to contact an outermost layer of the superconductor.

Typically, structure 520 has a curved configuration designed so that magnetic field lines 540 from the magnets of rail 510 intersect superconductor 280C of the structure approximately orthogonally. In the case where structure 520 does not move relative to the magnetic field lines, such a curved design may be implemented so that a large portion of the field lines, intersect the structure approximately orthogonally. For a given track with any given magnetic structure, the shape of the levitation surface can be adjusted to achieve any desired orthogonality ratio, and/or to achieve maximal values of the gradient of the orthogonal field component (maximal levitation force).

Figure 10:
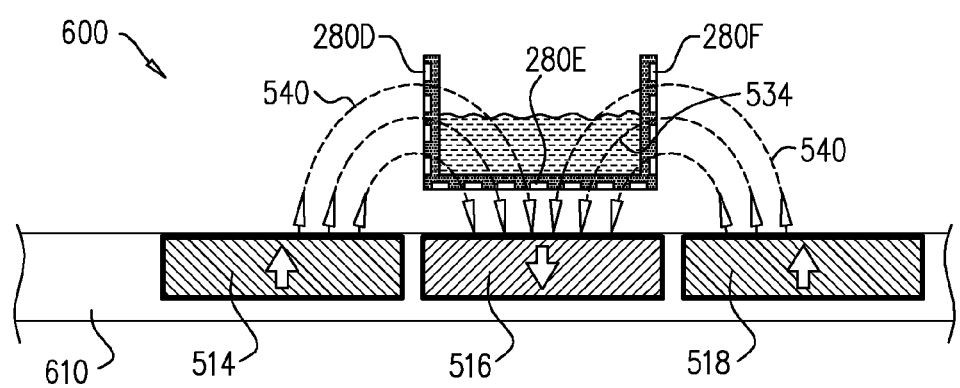
FIG. 10 is a schematic cross-section of an alternative levitating unit, according to an embodiment of the present invention.

FIG. 10 is a schematic cross-section of a levitating unit 600, according to an embodiment of the present invention. Apart from the differences described below, the operation of unit 600 is generally similar to that of unit 500 (FIG. 9), and elements indicated by the same reference numerals in both units 500 and 600 are generally similar in construction and in operation. Unit 600 is positioned above a rail 610 of permanent magnets. In contrast to rail 510, which has two lines of magnets 514, 516, rail 610 has three lines of magnets 514, 516, and 518, generating field lines 540 as shown in FIG. 10.

Unit 600 comprises multiple superconductors 280D, 280E, 280F, . . . , which are connected together so that the unit is able to hold liquid. In contrast to unit 500, superconductors 280D, 280E, 280F, . . . , of unit 600 are respectively configured as flat surfaces, and the surfaces are connected together. While, by way of example, unit 600 is assumed not to comprise an open-celled foam such as foam 530, addition of liquid nitrogen 534 to unit 600 enables the unit to levitate above rail 610.

The flat surfaces of superconductors 280D, 280E, 280F, . . . , may be configured so that magnetic field lines 540 from the three lines of magnets of rail 610 intersect superconductors 280D, 280E, 280F, . . . , of unit 600 approximately orthogonally. To maximize the levitating force, the gradients of the magnetic field components at the intersections should be as large as possible.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. Apparatus, comprising:
a permanent magnet, generating a magnetic field;
a substrate positioned within the magnetic field;
planar tapes, which overlie a surface of the substrate and which have respective mutually-opposing first and second faces and edges connecting the faces, each tape comprising, on at least the first face thereof, a superconducting material of a type selected so as to pin a flux of the magnetic field through the substrate, and
wherein the tapes are arranged on the substrate so as to define at least:
a first set of at least one of the planar tapes overlying the surface of the substrate so that the edges of adjacent sections of the tapes in the first set butt together along a first direction over the surface; and
a second set of at least another one of the planar tapes overlying the first set so that the edges of adjacent sections of the tapes in the second set butt together along a second direction that is different from the first direction.

2. The apparatus according to claim 1, wherein the surface comprises a topological equivalence of a disc surface, and wherein the planar tapes comprise discrete tape segments, and wherein the first set comprises a first plurality of the discrete tape segments, and wherein the second set comprises a second plurality of the discrete tape segments.

3. The apparatus according to claim 1, wherein the surface comprises a topological equivalence of a cylindrical surface, and wherein the first set comprises a first single planar tape overlying the surface, and wherein the second set comprises a second single planar tape overlying the first single planar tape.

4. The apparatus according to claim 1, wherein the second set comprises one or more layers of the planar tapes, the apparatus comprising an open-celled foam overlaying at least one of the substrate and an outermost layer of the second set of tapes.

5. The apparatus according to claim 1, and comprising at least one of a magnet, a bulk superconductor, and a set of tape layers behaving as a bulk superconductor, retained by a chassis in a first location thereof, and wherein the substrate and the first and second set are retained by the chassis in a second location thereof so as to stabilize a carriage comprising the chassis in the magnetic field.

6. The apparatus according to claim 1, wherein at least a portion of the surface is configured to be orthogonal to the magnetic field intersecting the surface.

7. The apparatus according to claim 1, wherein the permanent magnet and planar tapes are chosen and configured so that the flux that is pinned through the substrate is sufficient to cause the substrate to levitate in the magnetic field.

8. Apparatus, comprising:
a permanent magnet, generating a magnetic field;
a substrate positioned within the magnetic field;
planar tapes, which overlie a surface of the substrate and which have respective mutually-opposing first and second faces and edges connecting the faces, each tape comprising, on at least the first face thereof, a superconducting material of a type selected so as to pin a flux of the magnetic field through the substrate, and
wherein the tapes are arranged on the substrate so as to define at least:
a first set of at least one of the planar tapes overlying the surface of the substrate so that the edges of adjacent sections of the tapes in the first set are in proximity to each other and define respective seams; and
a second set of the planar tapes overlying the first set so that the tapes in the second set overlie the respective seams.

9. The apparatus according to claim 8, wherein the surface comprises a topological equivalence of a disc surface, and wherein the planar tapes comprise discrete tape segments, and wherein the first set comprises a first plurality of the discrete tape segments, and wherein the second set comprises a second plurality of the discrete tape segments.

10. The apparatus according to claim 8, wherein the surface comprises a topological equivalence of a cylindrical surface, and wherein the first set comprises a first single planar tape overlying the surface, and wherein the second set comprises a second single planar tape overlying the first single planar tape.

11. The apparatus according to claim 8, wherein the second set comprises one or more layers of the planar tapes, the apparatus comprising an open-celled foam overlaying at least one of the substrate and an outermost layer of the second set of tapes.

12. The apparatus according to claim 8, and comprising at least one of a magnet, a bulk superconductor, and a set of tape layers behaving as a bulk superconductor, retained by a chassis in a first location thereof, and wherein the substrate and the first and second set are retained by the chassis in a second location thereof so as to stabilize a carriage comprising the chassis in the magnetic field.

13. The apparatus according to claim 8, wherein at least a portion of the surface is configured to be orthogonal to the magnetic field penetrating the surface.

14. The apparatus according to claim 8, wherein the edges of the adjacent sections of the tapes in the first set butt together along a first direction over the surface, and wherein the edges of the adjacent sections of the tapes in the second set butt together along a second direction that is different from the first direction.

15. A method, comprising:
generating a magnetic field with a permanent magnet;
positioning a substrate within the magnetic field; and
forming an arrangement of planar tapes to overlie a surface of the substrate, the planar tapes having respective mutually-opposing first and second faces and edges connecting the faces, each tape comprising, on at least the first face thereof, a superconducting material of a type selected so as to pin a flux of the magnetic field through the substrate, the arrangement defining at least:
a first set of at least one of the planar tapes overlying the surface of the substrate so that the edges of adjacent sections of the tapes in the first set butt together along a first direction over the surface; and
a second set of at least another one of the planar tapes overlying the first set so that the edges of adjacent sections of the tapes in the second set butt together along a second direction that is different from the first direction.

16. The method according to claim 15, wherein the surface comprises a topological equivalence of a disc surface, and wherein the planar tapes comprise discrete tape segments, and wherein the first set comprises a first plurality of the discrete tape segments, and wherein the second set comprises a second plurality of the discrete tape segments.

17. The method according to claim 15, wherein the surface comprises a topological equivalence of a cylindrical surface, and wherein the first set comprises a first single planar tape overlying the surface, and wherein the second set comprises a second single planar tape overlying the first single planar tape.

18. The method according to claim 15, wherein the second set comprises one or more layers of the planar tapes, the method comprising overlaying an open-celled foam on at least one of the substrate and an outermost layer of the second set of tapes.

19. The method according to claim 15, and comprising retaining at least one of a magnet and a bulk superconductor by a chassis in a first location thereof, and retaining the substrate and the first and second set by the chassis in a second location thereof so as to stabilize a carriage comprising the chassis in the magnetic field.

20. The method according to claim 15, wherein at least a portion of the surface is configured to be orthogonal to the magnetic field intersecting the surface.

21. A method, comprising:
generating a magnetic field with a permanent magnet;
positioning a substrate within the magnetic field; and
forming an arrangement of planar tapes to overlie a surface of the substrate, the planar tapes having respective mutually-opposing first and second faces and edges connecting the faces, each tape comprising, on at least the first face thereof, a superconducting material of a type selected so as to pin a flux of the magnetic field through the substrate, the arrangement defining at least:
a first set of at least one of the planar tapes overlying the surface of the substrate so that the edges of adjacent sections of the tapes in the first set are in proximity to each other and define respective seams; and
a second set of the planar tapes overlying the first set so that the tapes in the second set overlie the respective seams.

22. The method according to claim 21, wherein the second set comprises one or more layers of the planar tapes, the method comprising overlaying an open-celled foam on at least one of the substrate and an outermost layer of the second set of tapes.

23. The method according to claim 21, and comprising retaining at least one of a magnet and a bulk superconductor by a chassis in a first location thereof, and retaining the substrate and the first and second set by the chassis in a second location thereof so as to stabilize a carriage comprising the chassis in the magnetic field.

* * * * *